United States Patent
Eglinger et al.

(10) Patent No.: US 7,983,054 B2
(45) Date of Patent: Jul. 19, 2011

(54) COMPACT CONTROL DEVICE FOR A MOTOR VEHICLE

(75) Inventors: Markus Eglinger, Neustadt/Aisch (DE); Joachim Buhl, Nuremberg (DE); Matthias Gramann, Renchen (DE); Steffen Fueller, Schwerin (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 91 days.

(21) Appl. No.: 12/311,983

(22) PCT Filed: Oct. 16, 2007

(86) PCT No.: PCT/DE2007/001836
§ 371 (c)(1),
(2), (4) Date: Jul. 21, 2009

(87) PCT Pub. No.: WO2008/046400
PCT Pub. Date: Apr. 24, 2008

(65) Prior Publication Data
US 2010/0027227 A1    Feb. 4, 2010

(30) Foreign Application Priority Data
Oct. 20, 2006 (DE) .......................... 10 2006 049 593

(51) Int. Cl.
*H05K 5/00* (2006.01)
(52) U.S. Cl. ........ 361/752; 361/772; 361/775; 174/250; 174/254
(58) Field of Classification Search .................. 361/600, 361/679.01, 688, 702, 704, 707–710, 714, 361/748, 749, 772, 775, 813; 257/666, 668, 257/734, 737, 778, E23.001, E23.124, E23.06; 174/250, 254, 68.1
See application file for complete search history.

(56) References Cited

U.S. PATENT DOCUMENTS
5,586,388 A * 12/1996 Hirao et al. ...................... 29/830
5,949,137 A *  9/1999 Domadia et al. ............... 257/712
(Continued)

FOREIGN PATENT DOCUMENTS
DE    40 23 319    12/1991
DE    42 28 818     3/1994
DE    295 08 661    9/1996
(Continued)

OTHER PUBLICATIONS
International Preliminary Report on Patentability for Application No. PCT/DE2007/001836, dated May 5, 2009, 6 pages, International Bureau of WIPO, Geneva, Switzerland.

*Primary Examiner* — Hung S Bui
(74) *Attorney, Agent, or Firm* — W. F. Fasse; W. G. Fasse

(57) ABSTRACT

A motor vehicle control device includes a housing lid and a base plate that are connected with each other in an oil-tight manner via a frame. An interconnect device with at least one electronic component and/or at least one electrical contact area is arranged on the base plate. Respectively in the area of an electronic component and/or an electrical contact area, the base plate includes a foil conductor strip, of which an end section facing the interconnect device in turn includes an electrical contact area. The frame completely surrounds the interconnect device and includes one opening respectively in the area of an electrical contact area of the foil strip. Via connection lines, the electronics on the interconnect device are electrically connected with the contact area in the opening, and thus with the electronic components outside the control device.

10 Claims, 2 Drawing Sheets

U.S. PATENT DOCUMENTS

| | | |
|---|---|---|
| 6,300,565 B1 | 10/2001 | Loibl et al. |
| 6,570,773 B1 | 5/2003 | Loibl et al. |
| 6,805,146 B2 * | 10/2004 | Albert et al. ............... 137/15.18 |
| 6,863,566 B2 * | 3/2005 | Scheuerer ..................... 439/587 |
| 7,193,852 B2 | 3/2007 | Wetzel |
| 2006/0023431 A1 | 2/2006 | Wetzel |
| 2006/0268529 A1 | 11/2006 | Büyükbas et al. |
| 2008/0019106 A1 | 1/2008 | Wetzel et al. |
| 2008/0108478 A1 | 5/2008 | Wetzel et al. |
| 2010/0020495 A1 * | 1/2010 | Eglinger et al. .............. 361/702 |

FOREIGN PATENT DOCUMENTS

| | | |
|---|---|---|
| DE | 197 12 842 | 8/1998 |
| DE | 199 07 949 | 9/2000 |
| DE | 103 15 432 | 10/2004 |
| DE | 103 15 438 | 10/2004 |
| DE | 103 40 974 | 3/2005 |
| DE | 102004061818 | 7/2006 |
| DE | 102005002813 | 10/2006 |
| DE | 102005046826 | 4/2007 |
| WO | WO 2006/108392 | 10/2006 |

* cited by examiner

COMPACT CONTROL DEVICE FOR A MOTOR VEHICLE

FIELD OF THE INVENTION

The invention relates to a control device for a motor vehicle, wherein the control device includes an electronic or electrical element arranged in an oil-tight housing. The invention further relates to a method of manufacturing such a control device.

BACKGROUND INFORMATION

For some time, it has been a standard procedure in the motor vehicle manufacturing industry to integrate control devices for the engine or gearbox into the motor vehicle assembly to be controlled, i.e. the engine or gearbox. The gear control devices in particular form an extremely compact unit as an on-site control device. In comparison with the conventional use of external control devices, this arrangement has enormous advantages in terms of costs, weight, functionality and quality. In particular, this results in a significant reduction in plug-in connections and lines.

The integration of the control device into the gearbox sets high demands on its thermal and mechanical stability. The functionality must be guaranteed both within a broad temperature range (approx. −40° C. to 150° C.) and under strong mechanical vibrations (up to approx. 40 g). Since the control device is surrounded by gear oil, it must also be oil-tight.

A control device of this type is known from DE 199 07 949 A1. A housing lid and a base plate to which a two-dimensional, flexible foil conductor is attached, surround a hollow space. In this hollow space, an electronic circuit is arranged on the base plate in such a manner that it is surrounded on all sides by the flexible printed circuit board. Conductive paths on the flexible printed circuit board are connected via bond wires with corresponding contact pads on the interconnect device. The housing lid is mounted to the base plate in an oil-tight manner via a continuous ring seal. The flexible printed circuit board is extended out of the hollow space of the control device housing between the ring seal and the base plate. The flexible printed circuit board creates the connection between the electronic circuit in the hollow space of the control device housing and electrical components such as sensors or actuators outside the hollow space.

The flexible printed circuit board is a single piece. With complex arrangements of the control device and the surrounding components, this leads to a large amount of waste of printed circuit board material and is therefore not economical, even if one only calculates or considers the recess for the electronic circuit in the center of the flexible printed circuit board.

Furthermore, the form of the flexible printed circuit board determines the position of the electrical components outside of the hollow space, and a change in the form of the entire flexible printed circuit board is required when the position of just one component is changed.

SUMMARY OF THE INVENTION

The object of the invention is to create a control device for a motor vehicle which enables an economic and mechanically reliable electrical connection between the control electronics of the control device and external electronic components in a compact design.

This object is attained according to the invention by a control device comprising: a base plate; an interconnect device, which is arranged on the base plate, and which comprises at least one electronic component and/or at least one electrical contact area; a frame which completely surrounds the interconnect device, which is coupled in an oil-tight manner with the base plate by a seal which completely surrounds the interconnect device; at least one foil strip which runs on the base plate for the electrical connection of electronic components within the frame with electronic components outside of the frame; electrical connection lines between the components and/or the contact areas on the interconnect device and the foil conductor; and a housing lid, which is coupled in an oil-tight manner with the frame. The invention is further characterized by the following features. The foil conductors are designed as several separate foil conductor strips, which on their end sections which face toward the interconnect device comprise one electrical contact area respectively, wherein the end sections are arranged outside of the seal which completely surrounds the interconnect device. The frame in the area of the electrical contact area of a foil conductor strip comprises an opening for guiding through the electrical connection lines from the components and/or the contact areas on the interconnect device to the electrical contact area of the foil conductor strip. The frame cooperates with a seal which runs around the opening and which surrounds the electrical contact area of the foil conductor strip, by which the frame is coupled in the area of the opening with the foil conductor strip on the base plate in an oil-tight manner.

Conveniently, the foil conductors are designed as separate foil conductor strips. As a result, foil conductor material is saved, and when changes are made to the position of an electronic component outside of the frame which completely surrounds the interconnect device, the position of the corresponding foil conductor can be quickly adapted while retaining the position of the remaining foil conductors.

The foil conductor strips comprise on their end sections which face towards the interconnect device one electrical contact area respectively, wherein all end sections are arranged outside of the seal of the frame which completely surrounds the interconnect device. This guarantees that the seal which runs around the entire frame, and which surrounds the interconnect device, runs solely between the base plate and the frame. The frame comprises an opening in the area of the electrical contact area of a foil conductor strip. Through this opening, the electrical connection lines, in particular bond wires, are installed between the components and/or the contact areas on the interconnect device and the electrical contact area of the foil conductor strip. The frame is coupled in an oil-tight manner with the base plate in the area of the opening by means of a seal which runs around the entire opening and which surrounds the electrical contact area of the foil conductor strip, wherein the seal which runs around the opening is preferably arranged within the foil conductor strip.

In order to guarantee a mechanical strength which meets requirements, the base plate must be of a certain thickness. Advantageously, additional components such as connectors, sensors or actuators are arranged on the base plate. In order to achieve the lowest possible construction height of the control device, the frame which surrounds the interconnect device is housed in a depression in the base plate.

Preferably, the seal which runs around the entire frame and the seal which runs around an opening are produced from a single piece. As a result, in cases when the seal is designed as an insertion piece, the positioning of the sealing element is made easier due to the elimination of at least one operating stage. The respective sealing surfaces of the seals are separated by a groove in the area of openings, where they run almost parallel and adjacent to each other. As a result, the sealing areas of the openings are separated from the sealing area of the interconnect device as is the case with individual seals.

In a further embodiment of the control device, the lid and frame are designed as a single-piece housing. Here, the housing in the lid comprises a recess respectively in the area which comprises an electronic component and/or a contact area of the interconnect device and an electrical contact area of the corresponding end section of the foil conductor strip. As a result of this recess, an electrical connection between the electronic component and/or the contact area of the interconnect device and the electrical contact area of the corresponding end section of the foil conductor strip can be created by means of the electrical connection lines. The recess can then be closed in an oil-tight manner with a lid part by means of laser welding or adhesion or caulking.

In cases when the control device is used in a gearbox, installation space is advantageously saved due to the fact that the base plate of the control device is a part of the gear hydraulic unit, for example the valve plate.

A further object of the invention is to provide a method for producing a control device for a motor vehicle with the inventive features.

This object is attained according to the invention by a method comprising the steps: preparing the base plate; attaching the interconnect device to the base plate, wherein the interconnect device comprises the at least one electronic component and/or the at least one electrical contact area; positioning and affixing the several separate foil conductor strips on the base plate in such a manner that the end sections of the foil conductor strips which face toward the interconnect device and which have the electrical contact area thereon are affixed in the area of the at least one electronic component and/or the electrical contact area of the interconnect device; mounting the frame which completely surrounds the interconnect device in such a manner that the opening of the frame is arranged over the electrical contact area on the end section of a respective one of the foil conductor strips, wherein the frame is coupled in an oil-tight manner with the base plate in the immediate area of the interconnect device by the seal which runs between the interconnect device and the end sections of the foil conductor strips, and in the area of the opening by the seal which runs around the opening, surrounds the electrical contact area of a respective one of the foil conductor strips and which is arranged within the foil conductor strip; attaching the electrical connection lines between the electronic components and/or the electrical contact areas on the interconnect device and the electrical contact area of the foil conductor strip through the corresponding opening; and mounting the housing lid which can be coupled in an oil-tight manner via another seal with the frame.

First, an interconnect device is directly attached to a base plate, e.g. by means of an adhesive. In this way, the base plate acts particularly effectively as a heat sink for the electronic components on the interconnect device. In particular, additional contact areas are also arranged on the interconnect device which are electrically connected via conductive paths to electronic components which are not arranged in the edge area of the interconnect device.

Then, several foil conductors, which are essentially in strip form, are positioned and affixed on the base plate at a distance from each other around the interconnect device. The foil conductor strips comprise on their end sections facing towards the interconnect device one electrical contact area respectively. The position of a foil conductor strip is selected in such a manner that the end section which is equipped with an electrical contact area is arranged in the area of at least one electronic component and/or electrical contact area of the interconnect device. The foil conductor strips are preferably affixed using cold lamination or adhesion.

During the next stage, a frame is arranged on the base plate in such a manner that it completely surrounds the interconnect device, and that an opening in the frame is positioned over the corresponding electrical contact area of an end section of a foil conductor strip in such a manner that the seal which runs around in the opening of the frame completely surrounds the electrical contact area. Here, it should be ensured that the seal only runs on the foil conductor strip, since a transfer from the foil conductor strip to the base plate can hardly be sealed in an oil-tight manner. A seal between the base plate and the frame which completely surrounds the interconnect device, and which is positioned between the end sections of the foil conductor strips and the interconnect device guarantees the oil-tightness of the control device in this area after the frame has been mounted to the base plate. The frame can be mounted to the base plate using screwing, riveting, adhering or another technique with which persons skilled in the art will be familiar.

Then, the electronic components and/or the electrical contact areas on the interconnect device are electrically connected by means of electrical connection lines to the corresponding electrical contact areas on the end sections of the foil conductor strips through the respective openings in the frame. Here, the installation of bond wires is preferred.

Finally, a lid is mounted onto the frame. The oil-tightness is guaranteed by a seal which runs around in the lid or in the frame. The lid can be mounted on the frame using screwing, riveting, adhering or another technique with which persons skilled in the art will be familiar.

A further object of the invention is to provide a method for producing a control device for a motor vehicle having the above inventive features and further having the frame integrated on the housing lid.

This object is attained according to the invention by a method wherein the housing lid and the frame are designed as a single piece, and the method comprises steps as follows.

The attachment of the interconnect device and the foil conductor strips is achieved analogously to the method described above. The housing lid is then mounted to the base plate in the same manner as the frame in the previous method. The seal which surrounds the interconnect device and the seals which surround the electrical contact areas on the end sections of the foil conductor strips are in this case housed in an edge which runs on the inside of the lid.

In the next stage, the electronic components and/or the electrical contact areas on the interconnect device are electrically connected with the corresponding electrical contact areas on the end sections of the foil conductor strips by respective recesses in the housing lid. Here, the installation of bond wires is also preferred.

Finally, the recesses are closed in an oil-tight manner by corresponding lid parts using laser welding, adhering or another known technique.

BRIEF DESCRIPTION OF THE DRAWINGS

Further features, advantages and details are presented in the following description, in which preferred exemplary embodiments are explained in greater detail, and in which.

DETAILED DESCRIPTION OF EXAMPLE EMBODIMENTS OF THE INVENTION

Figure 1:
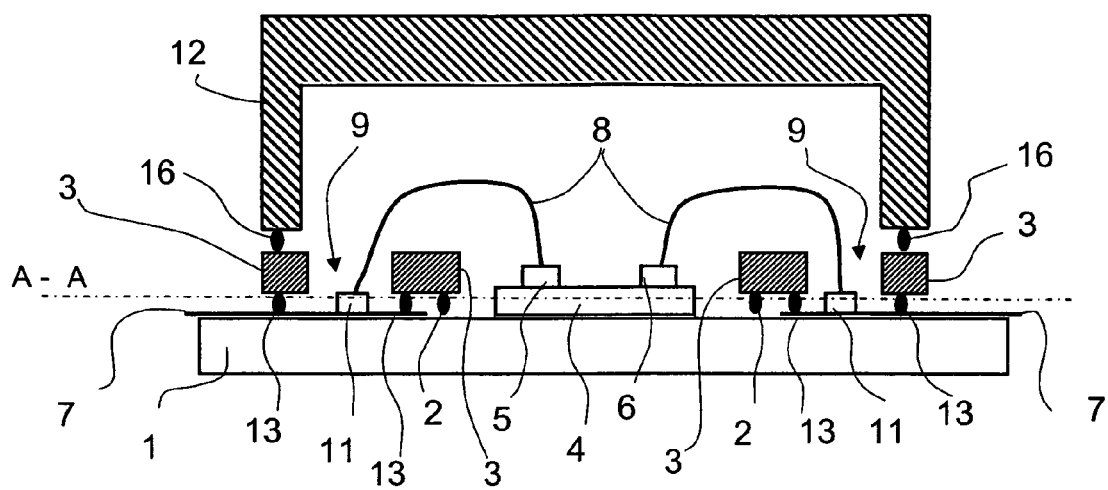
FIG. 1 shows a cross-section through a control device with a frame and separate housing lid.

FIG. 1 shows a control device in which an interconnect device 4 is directly arranged on a base plate 1. The connection can be achieved by means of lamination, in particular cold lamination, or adhesion, preferably with an electrically insulating heat conducting adhesive. The base plate 1 is in particular made of metal and then acts simultaneously as a heat sink for the heat generated on the interconnect device 4. On the interconnect device 4, preferably in its edge area, at least one electronic component 5 of the control electronics is arranged. Components which are primarily arranged in the inner area of the interconnect device 4 are in particular electrically connected via conductive paths of the interconnect device 4, not shown here, with electrical contact areas 6 in the edge area of the interconnect device 4.

On the base plate 1, flexible foil conductor strips 7 are arranged around the interconnect device 4, leading away from the interconnect device 4. The electronic contact area 11 which is arranged on the end section 10 of a foil conductor strip 7 which faces towards the interconnect device 4 is here positioned respectively opposite a component 5 and/or a contact area 6 of the interconnect device 4. The foil conductor strips 7 are preferably laminated on or adhered to the base plate 1.

The interconnect device 4 is surrounded on all sides by a frame 3. The frame is preferably made of plastic and is force-fit connected with the base plate 1, for example by screwing or riveting. In the inner circumferential area of the frame 3, a seal 2 which surrounds the interconnect device 4 runs between the interconnect device 4 and the end sections 10 of the foil conductor strips 7, and couples in this area the frame 3 with the base plate 1 in an oil-tight manner.

The outer circumferential area of the frame 3 comprises one opening 9 respectively in the area of an electrical contact area 11 of a foil conductor strip 7. The contact area 11 lies freely in the opening. A seal 13 which runs around the opening 9 couples in this area the frame 3 with the foil conductor strip 7 on the base plate 1 in an oil-tight manner. Preferably, the seal 13 runs around the opening 9 entirely on the foil conductor strip 7, since a transfer from the foil conductor strip 7 to the base plate 1 could lead to a loss of tightness.

The electrical connection lines 8 run from the electronic components 5 and the electrical contact areas 6 on the interconnect device 4 through the openings 9 to the contact areas 11 on the foil conductor strips 7. As a result, the electronics within the frame 3 are electrically connected with electronic components such as actuators, sensors or connectors outside of the frame 3. The electrical connection lines 8 are usually realised by means of bond wires. The housing lid 12 is connected in an oil-tight manner to the frame 3 via the ring seal 16, for example by means of screws.

Figure 2:
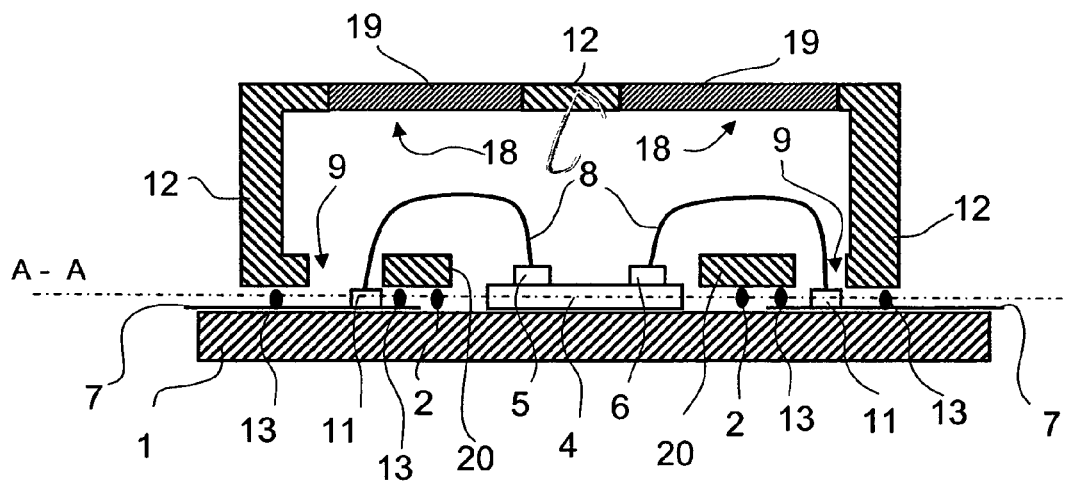
FIG. 2 shows a cross-section through a control device with a frame and housing lid made of a single piece.

FIG. 2 shows a control device as in FIG. 1, but with the difference that the frame 3 from FIG. 1 is integrated in the housing lid 12, and now forms an edge 20 of the housing lid 12 which completely surrounds the interconnect device 4. As a result, the seal 16 which in FIG. 1 is arranged between the housing lid 12 and the frame 3 is no longer required.

The electrical connection lines 8 which are usually designed as bond wires between the electronic components 5 and/or the electrical contact areas 6 on the interconnect device 4 and the contact areas 11 on the foil conductors 7 are inserted through recesses 18 in the housing lid 12. The recesses 18 can be closed in an oil-tight manner via the lid parts 12, in particular by means of laser welding, adhesion or caulking.

Figure 4:
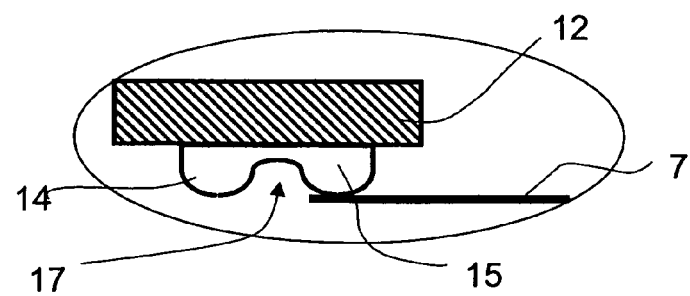
FIG. 4 shows a cross-section through a single-piece seal in the area of an opening.

In a particular embodiment, the seals 2, 13 which surround the interconnect device 4 and the openings 9 can be designed from a single piece. Mounting is made significantly easier when seals 2, 13 are inlaid. Here, it should be ensured for safety reasons that the seal area around the interconnect device 4 is separated from the seal area around the openings 9. As shown in FIG. 4, the seal areas 14, 15 of the seals 2, 13 are separated in the area of an opening 9 by a groove 17 when they run essentially parallel and adjacent to each other. When the frame 3 from FIG. 1 or the edge 20 from FIG. 2 is attached, it should be ensured that the seal area 15 of the seal 13 comes to rest on the end section 10 of the foil conductor 7 and the groove 17 comes to rest between the interconnect device 4 and the end section 10.

Figure 3:
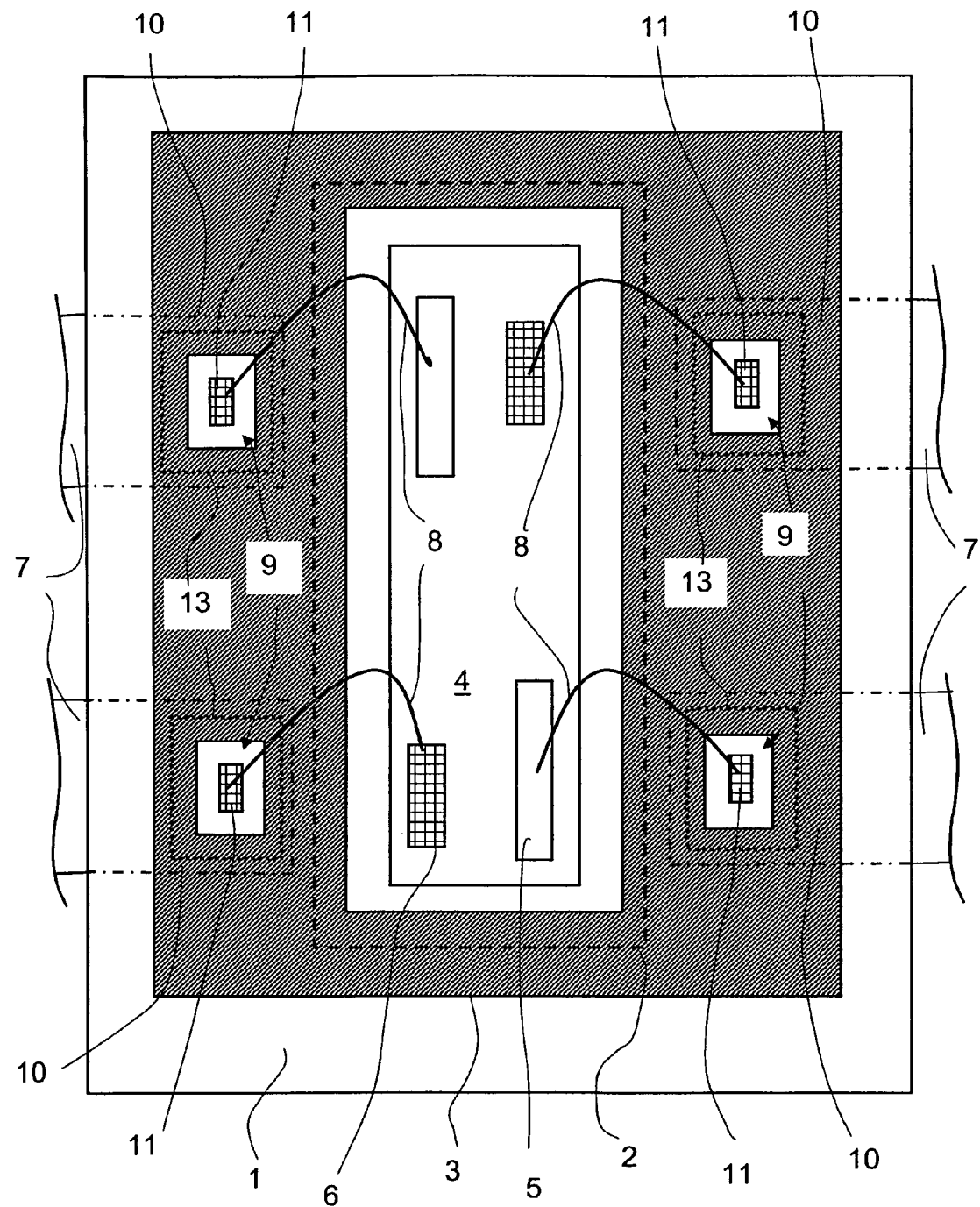
FIG. 3 shows a top view of FIG. 1 or FIG. 2 in the respective plane A-A.

FIG. 3 shows a top view of FIG. 1 or FIG. 2 respectively on the A-A plane. There, the position of the interconnect device 4, the frame 3 and the edge 20 of the seals 2, 13, foil strips 7 and openings 9 is again illustrated. Among other elements, it is shown how in the area of an opening 9, the end section 10 in particular of the foil conductor 7 completely covers the opening 9, and how the seal 13 which surrounds the opening 9 is arranged for tightness purposes completely within the foil conductor 7.

In cases when the control device is used in a gearbox, installation space can be saved when the base plate 1 of the control device is part of the gear hydraulic unit, for example, the valve plate. In an alternative embodiment of the control device, the housing lid 12 can for reasons of simplicity be designed as a flat part, and the base plate 1 can comprise a corresponding depression to hold the interconnect device 4 and the frame 3.

LIST OF REFERENCE NUMERALS

1. Base plate
2. Seal on the interconnect device 4
3. Frame
4. Interconnection device
5. Electronic component on the interconnect device
6. Electrical contact area on the interconnect device
7. Foil conductor
8. Electrical connection line
9. Opening in the frame or in the housing lid 12
10. End section of the foil conductor facing the interconnect device
11. Electrical contact area on the end section of the foil conductor
12. Housing lid
13. Seal surrounding the opening
14. Sealing surface of the seal 2
15. Sealing surface of the seal 13
16. Seal between the housing lid and the base plate
17. Groove between seal surface 14 and seal surface 15
18. Recess in the housing lid
19. Lid part
20. Edge of the housing lid

The invention claimed is:

1. A control device for a motor vehicle which comprises:
   a) a base plate (1),
   b) an interconnect device (4), which is arranged on the base plate (1), and which comprises at least one electronic component (5) and/or at least one electrical contact area (6), c) a frame (3) which completely surrounds the interconnect device (4), which is coupled in an oil-tight manner with the base plate (1) by a seal which completely surrounds the interconnect device (4), d) at least one foil strip (7) which runs on the base plate (1) for the electrical connection of electronic components within the frame (3) with electronic components outside of the frame (3), and e) electrical connection lines (8) between the components (5) and/or the contact areas (6) on the interconnect device (4) and the foil conductor (7), f) a housing lid (12), which is coupled in an oil-tight manner with the frame (3), characterized in that g) the foil conductors (7) are designed as several separate foil conductor strips, which on their end sections (10) which face towards the interconnect device (4) comprise one electrical contact area (11) respectively, wherein the end sections (10) are arranged outside of the seal (2) which completely surrounds the interconnect device (4), h) the frame (3) in the area of the electrical contact area (11) of a foil conductor strip (7) comprises an opening (9) for guiding through the electrical connection lines (8) from the components (5) and/or the contact areas (6) on the interconnect device (4) to the electrical contact area (11) of the foil conductor strip (7), and i) the frame (3) cooperates with a seal (13) which runs around the opening (9) and which surrounds the electrical contact area (11) of the foil conductor strip (7), by which the frame (3) is coupled in the area of the opening (9) with the foil conductor strip on the base plate (1) in an oil-tight manner.

2. The control device according to claim 1, characterized in that the seal (13) which runs around the opening (9) is positioned completely within the foil conductor strip (7).

3. A method of producing the control device for a motor vehicle according to claim 1, characterized by the following steps:

a) preparing the base plate (1), b) attaching the interconnect device (4) to the base plate (1), wherein the interconnect device (4) comprises the at least one electronic component (5) and/or the at least one electrical contact area (6), c) positioning and affixing the several separate foil conductor strips on the base plate (1) in such a manner that the end sections (10) of the foil conductor strips (7) which face towards the interconnect device (4) and which have the electrical contact area (11) thereon are affixed in the area of the at least one electronic component (5) and/or the electrical contact area (6) of the interconnect device (4), d) mounting the frame (3) which completely surrounds the interconnect device (4) in such a manner that the opening (9) of the frame (3) is arranged over the electrical contact area (11) on the end section (10) of a respective one of the foil conductor strips (7), wherein the frame (3) is coupled in an oil-tight manner with the base plate (1)
   in the immediate area of the interconnect device (4) by the seal (2) which runs between the interconnect device (4) and the end sections (10) of the foil conductor strips (7), and
   in the area of the opening (9) by the seal (13) which runs around the opening (9), surrounds the electrical contact area (11) of a respective one of the foil conductor strip strips (7) and which is arranged within the foil conductor strip (7), e) attaching the electrical connection lines (8) between the electronic components (5) and/or the electrical contact areas (6) on the interconnect device (4) and the electrical contact area of the foil conductor strip (11) through the corresponding opening (9), and f) mounting the housing lid (12) which can be coupled in an oil-tight manner via another seal (16) with the frame (3).

4. The control device according to claim 1, characterized in that the base plate (1) comprises a depression for holding the frame (3).

5. The control device according to claim 1, characterized in that the seal (2) which surrounds the interconnect device (4) and the seal (13) which surrounds an opening (9) are made of a single piece, wherein the respective sealing areas (14, 15) are separated by a groove (17) in the area of openings (9) when they run almost parallel and adjacent to each other.

6. The control device according to claim 1, characterized in that the frame (3) is integrated on the housing lid (12).

7. The control device according to claim 6, characterized in that the housing lid (12) comprises one recess (18) respectively in the area which comprises an electronic component (5) and/or an electrical contact area (6) on the interconnect device (4) and an electrical contact area (11) of the corresponding end section (10) of the foil conductor strip (7), through which an electrical connection can be created between the electronic component (5) and/or the contact area (6) of the interconnect device (4) and the electrical contact area (11) of the corresponding end section (10) of the foil conductor strip (7) by the electrical connection lines (8), wherein the recess (18) can be closed in an oil-tight manner with a lid part (19).

8. The control device according to claim 7, characterized in that the recess (18) is closed in an oil-tight manner with the lid part (19) by a laser weld joint or an adhesion joint or a caulking joint.

9. The control device according to claim 1, characterized in that the base plate (1) is part of a transmission hydraulic unit.

10. A method of producing the control device for a motor vehicle according to claim 6, characterized by the following steps:

a) preparing the base plate (1), b) attaching the interconnect device (4) on the base plate (1), wherein the interconnect device (4) comprises the at least one electronic component (5) and/or the at least one electrical contact area (6), c) positioning and affixing the several separate foil conductor strips on the base plate (1) in such a manner that the end sections (10) of the foil conductor strips (7) which face towards the interconnect device (4) and which have the electrical contact area (11) thereon are affixed in the area of the at least one electronic component (5) and/or the electrical contact area (6) of the interconnect device (4), d) mounting the housing lid, which is an essentially hood-shaped housing lid (12) with an edge (20) which runs in the inside of the lid and which completely surrounds the interconnect device (4) in such a manner that an opening (9) of the edge (20) is arranged over the electrical contact area (11) on the end section (10) of the foil conductor strip (7), wherein the edge (20) is coupled with the base plate (1) in an oil-tight manner
   in the immediate area of the interconnect device (4) by the seal (2) which surrounds the interconnect device (4) and which runs between the interconnect device (4) and the end sections (10) of the foil conductor strips (7), and in the area of the opening (9) by the seal (13) which runs around the opening (9), which surrounds the electrical contact area (11) of a respective one of the foil conductor strips (7), and which is arranged within the foil conductor strip (7), e) attaching the electrical connection lines (8) between the electronic components (5) and/or the electrical contact areas (6) on the interconnect device (4) and the electrical contact area (11) of a respective one of the foil conductor strips (7) from outside the housing lid (12) through at least one recess (18) in the housing lid (12), and f) mounting a lid part (19) which is coupled with the housing lid (12) by laser welding or adhesion or caulking, and which closes a recess (18) of the housing lid in an oil-tight manner.

\* \* \* \* \*